United States Patent
Chang et al.

(10) Patent No.: US 12,417,987 B2
(45) Date of Patent: *Sep. 16, 2025

(54) SEMICONDUCTOR DIE INCLUDING GUARD RING STRUCTURE AND THREE-DIMENSIONAL DEVICE STRUCTURE INCLUDING THE SAME

(71) Applicant: Taiwan Semiconductor Manufacturing Company Limited, Hsinchu (TW)

(72) Inventors: Jen-Yuan Chang, Hsinchu (TW); Chien-Chang Lee, Hsinchu (TW); Chia-Ping Lai, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/669,577

(22) Filed: May 21, 2024

(65) Prior Publication Data

US 2024/0312931 A1 Sep. 19, 2024

Related U.S. Application Data

(63) Continuation of application No. 18/338,596, filed on Jun. 21, 2023, now Pat. No. 12,027,475, which is a (Continued)

(51) Int. Cl.
*H01L 23/58* (2006.01)
*H01L 21/768* (2006.01)
(Continued)

(52) U.S. Cl.
CPC ...... *H01L 23/585* (2013.01); *H01L 21/76898* (2013.01); *H01L 23/481* (2013.01);
(Continued)

(58) Field of Classification Search
CPC ............ H01L 23/585; H01L 21/76898; H01L 23/481
See application file for complete search history.

(56) References Cited

U.S. PATENT DOCUMENTS 8,168,529 B2 * 5/2012 Lin ................... H01L 25/0657
438/622
8,890,293 B2 * 11/2014 Lu ........................ H01L 21/76
257/490

(Continued)

FOREIGN PATENT DOCUMENTS

CN 114709179 A * 7/2022 ........... H01L 21/568
CN 114765153 A * 7/2022 ........... H01L 21/486
(Continued)

OTHER PUBLICATIONS

TW Patent and Trademark Office; TW Application No. 111119242; Office Action mailed Oct. 23, 2024; 8 pages.

*Primary Examiner* — Laura M Menz
(74) *Attorney, Agent, or Firm* — The Marbury Law Group, PLLC (57) ABSTRACT

A die includes: a semiconductor substrate; an interconnect structure disposed on the semiconductor substrate and including: inter-metal dielectric (IMD) layers; metal features embedded in the IMD layers; and a guard ring structure including concentric first and second guard rings that extend through at least a subset of the IMD layers; and a through silicon via (TSV) structure extending through the semiconductor substrate and the subset of IMD layers to electrically contact one of the metal features. The first guard ring surrounds the TSV structure; and the second guard ring surrounds the first guard ring and is configured to reduce a parasitic capacitance between the guard ring structure and the TSV structure.

20 Claims, 10 Drawing Sheets

Related U.S. Application Data continuation of application No. 17/458,687, filed on Aug. 27, 2021, now Pat. No. 11,728,288.

(51) Int. Cl.
  *H01L 23/48* (2006.01)
  *H01L 23/522* (2006.01)
  *H01L 25/065* (2023.01)
  *H01L 23/00* (2006.01)
  *H01L 25/18* (2023.01)

(52) U.S. Cl.
  CPC ...... *H01L 23/5222* (2013.01); *H01L 25/0657* (2013.01); *H01L 23/562* (2013.01); *H01L 25/18* (2013.01); *H01L 2225/06544* (2013.01)

(56) References Cited

U.S. PATENT DOCUMENTS

| | | | | |
|---|---|---|---|---|
| 9,691,684 | B2* | 6/2017 | Park | H01L 21/76898 |
| 10,204,952 | B2* | 2/2019 | Huang | H01L 23/481 |
| 10,600,888 | B2* | 3/2020 | Or-Bach | H10D 89/10 |
| 10,784,185 | B2* | 9/2020 | Li | H01L 24/92 |
| 11,270,952 | B2* | 3/2022 | Wang | H01L 23/585 |
| 11,728,288 | B2* | 8/2023 | Chang | H01L 21/76898 |
| | | | | 257/621 |
| 11,855,130 | B2* | 12/2023 | Chang | H10D 1/716 |
| 11,869,859 | B2* | 1/2024 | Chang | H01L 24/08 |
| 12,027,475 | B2* | 7/2024 | Chang | H01L 23/481 |
| 12,125,761 | B2* | 10/2024 | Chang | H01L 24/83 |
| 12,154,869 | B2* | 11/2024 | Chang | H01L 23/49822 |
| 2010/0187671 | A1* | 7/2010 | Lin | H01L 21/76898 |
| | | | | 257/773 |
| 2012/0273782 | A1* | 11/2012 | Goel | H01L 22/32 |
| | | | | 716/112 |
| 2015/0061147 | A1* | 3/2015 | Lin | H01L 23/53209 |
| | | | | 438/653 |
| 2015/0348871 | A1* | 12/2015 | Chiang | H01L 23/481 |
| | | | | 257/751 |
| 2022/0262695 | A1* | 8/2022 | Chang | H01L 25/0657 |
| 2022/0301981 | A1* | 9/2022 | Chang | H01L 23/585 |
| 2022/0302050 | A1* | 9/2022 | Chang | H01L 23/564 |
| 2022/0310570 | A1* | 9/2022 | Chang | H01L 25/105 |
| 2023/0060208 | A1* | 3/2023 | Chang | H01L 22/32 |
| 2023/0060265 | A1* | 3/2023 | Chang | H01L 23/62 |
| 2023/0061861 | A1* | 3/2023 | Chang | H01L 25/18 |
| 2023/0062027 | A1* | 3/2023 | Chang | H01L 25/50 |
| 2023/0067714 | A1* | 3/2023 | Chang | H01L 25/0657 |
| 2023/0069315 | A1* | 3/2023 | Chang | H01L 24/08 |
| 2023/0307384 | A1* | 9/2023 | Chang | H01L 23/49827 |
| 2023/0352427 | A1* | 11/2023 | Chang | H01L 23/481 |
| 2023/0378136 | A1* | 11/2023 | Chang | H01L 25/50 |
| 2023/0378247 | A1* | 11/2023 | Chang | H10D 1/716 |
| 2024/0312931 | A1* | 9/2024 | Chang | H01L 23/522 |
| 2025/0054881 | A1* | 2/2025 | Chang | H01L 24/08 |

FOREIGN PATENT DOCUMENTS

| | | | | | |
|---|---|---|---|---|---|
| CN | 114783957 | A | * | 7/2022 | ............ H01L 21/56 |
| CN | 114823554 | A | * | 7/2022 | ......... H01L 23/3107 |
| CN | 114823620 | A | * | 7/2022 | ....... H01L 21/76898 |
| CN | 115513180 | A | * | 12/2022 | ......... H01L 23/5384 |
| CN | 115527985 | A | * | 12/2022 | ............ H01L 23/10 |
| CN | 115527987 | A | * | 12/2022 | ....... H01L 21/76898 |
| CN | 115527990 | A | * | 12/2022 | ......... H01L 21/4857 |
| CN | 115527992 | A | * | 12/2022 | ............ H01L 24/06 |
| CN | 115528007 | A | * | 12/2022 | ............ H01L 21/56 |
| CN | 115528008 | A | * | 12/2022 | ......... H01L 23/3128 |
| CN | 116454049 | A | * | 7/2023 | ........... H01L 23/481 |
| EP | 4089725 | A1 | * | 11/2022 | ......... H01L 21/4846 |
| JP | 2010166052 | A | | 7/2010 | ......... H01L 21/3065 |
| TW | 202131471 | A | | 8/2021 | |
| TW | 202326984 | A | * | 7/2023 | ....... H01L 21/76898 |
| TW | 202329383 | A | * | 7/2023 | ....... H01L 21/76898 |

* cited by examiner

SEMICONDUCTOR DIE INCLUDING GUARD RING STRUCTURE AND THREE-DIMENSIONAL DEVICE STRUCTURE INCLUDING THE SAME

RELATED APPLICATIONS

This application is a continuation of U.S. patent application Ser. No. 18/338,596 entitled "Semiconductor Die Including Guard Ring Structure and Three-Dimensional Device Structure Including the Same" filed Jun. 21, 2023, which is a continuation of U.S. patent application Ser. No. 17/458,687, entitled "Semiconductor Die Including Guard Ring Structure and Three-Dimensional Device Structure Including the Same" filed Aug. 27, 2021, now patented as U.S. Pat. No. 11,728,288, the entire contents of both of which are hereby incorporated by reference for all purposes.

BACKGROUND

With the progress of transistor process technology, the dimensions of transistors have decreased. Conversely, the number of transistors per unit area of an integrated circuit has increased accordingly. The increased device density utilizes higher interconnect technology that can achieve signal transport between devices with a desired speed and satisfy low resistance and low capacitance (e.g., low RC time constant) requirements. The effect of interconnect RC time constant on signal delay is exacerbated as integrated circuits become more complex and feature sizes decreases. In semiconductor back-end-of line (BEOL) processing, metal interconnect structures are fabricated with inter-metal dielectric (IMD) layers, which can contribute capacitance to the metal interconnect structures. Thus, increasing the RC time constant delay. The capacitance contribution can undesirably reduce signal transport speed of the semiconductor circuitry.

The use of low dielectric constant (low-k) dielectric material to form the IMD layers has to some extent reduced the capacitance contribution and improved signal transport speed. However, the low-k dielectric material has disadvantageous features and properties such as high porosity, which make it susceptible to damage during certain semiconductor processes such as etching, deposition, and wet processes, which can degrade (increase) their dielectric constants.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within the same thickness range.

The present disclosure is directed to semiconductor dies including a guard ring structure disposed around through-silicon via (TSV) structures, and three-dimensional device structures that include one or more of the semiconductor dies.

Figure 1A:
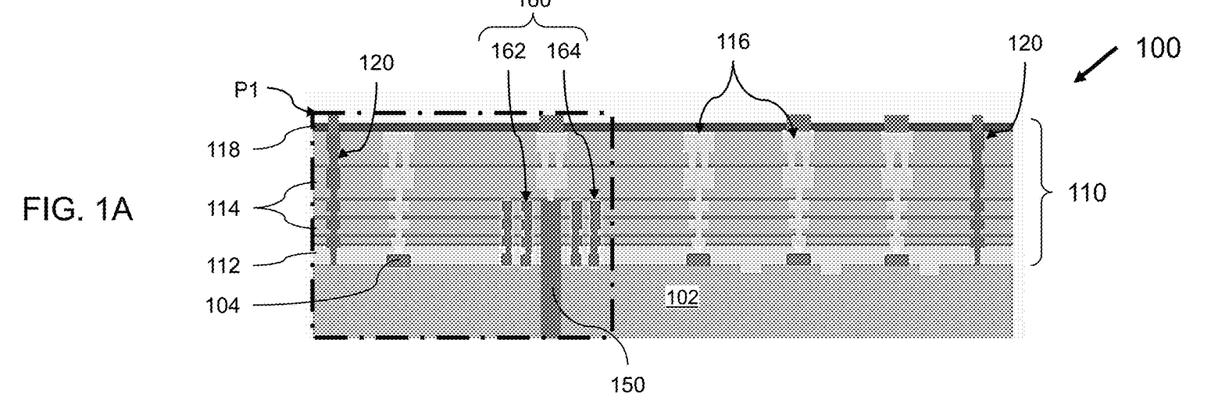
FIG. 1A is a vertical cross-sectional view of a semiconductor die, according to various embodiments of the present disclosure.
Figure 1B:
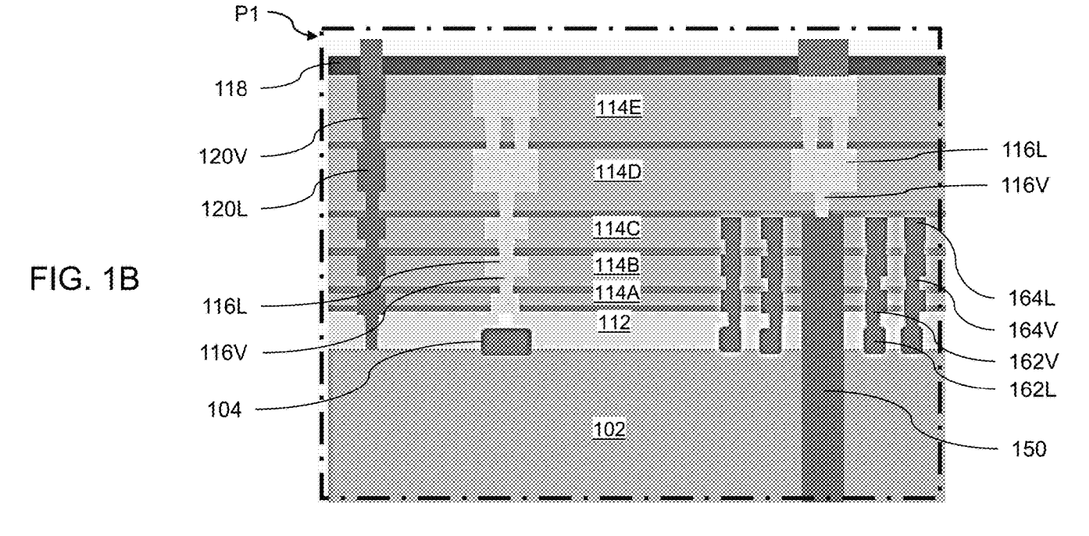
FIG. 1B is an enlarged portion P1 of the semiconductor die of FIG. 1A.

FIG. 1A is a vertical cross-sectional view of a semiconductor die, according to various embodiments of the present disclosure. FIG. 1B is an enlarged view of a portion of FIG. 1A. Referring to FIG. 1A, a first semiconductor die 100 includes a semiconductor substrate 102 and a first interconnect structure 110. In some embodiments, the first semiconductor substrate 102 may include an elementary semiconductor such as silicon or germanium and/or a compound semiconductor such as silicon germanium, silicon carbide, gallium arsenic, indium arsenide, gallium nitride or indium phosphide. Other semiconductor materials are within the contemplated scope of disclosure. In some embodiments, the semiconductor substrate 102 may be a semiconductor-on-insulator (SOI) substrate. In various embodiments, the first semiconductor substrate 102 may take the form of a planar substrate, a substrate with multiple fins, nanowires, or other forms known to people having ordinary skill in the art. Depending on the requirements of design, the semiconductor substrate 102 may be a P-type substrate or an N-type substrate and may have doped regions therein. The doped regions may be configured for an N-type device or a P-type device.

In some embodiments, the first semiconductor substrate 102 includes isolation structures defining at least one active area, and a first device layer may be disposed on/in the active area. The first device layer may include a variety of devices. In some embodiments, the devices may include active components, passive components, a combination thereof, or the like. In some embodiments, the devices may include integrated circuits devices. The devices may be, for example, transistors, capacitors, resistors, diodes, photodiodes, fuse devices, or other similar devices. In some embodiments, the first device layer includes gate electrodes 104, source/drain regions, spacers, and the like.

The first interconnect structure 110 may include an interlayer dielectric (ILD) layer 112, a passivation layer 118, one or more inter-metal dielectric (IMD) layers 114, metal features 116, a first seal ring 120, and a guard ring structure 160. In some embodiments, the ILD layer 112 may be formed of a dielectric material such as silicon oxide ($SiO_2$) silicon nitride (SiN or $Si_3N_4$), silicon carbide (SiC), or the like, and may be deposited by any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a low pressure CVD process, a metalorganic CVD (MOCVD) process, a plasma enhanced CVD (PECVD) process, a sputtering process, laser ablation, or the like.

In some embodiments, the interconnect structure 110 may include five IMD layers 114A-114E as shown in FIGS. 1A and 1B. However, the present disclosure is not limited to any particular number of IMD layers 114. The IMD layers 114 may include an extra low-k (ELK) dielectric material having a dielectric constant (k) less than about 2.6, such as from 2.5 to 2.2. In some embodiments, ELK dielectric materials include carbon-doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials may include porous versions of existing dielectric material, such as porous hydrogen silsesquioxane (HSQ), porous methyl silsesquioxane (MSQ), porous polyarylether (PAE), porous SiLK, or porous $SiO_2$. Other suitable ELK materials are within the contemplated scope of disclosure. The IMD layers 114 may be formed by any suitable deposition process. In some embodiments, the IMD layers 114 may be deposited by a PECVD process or by a spin coating process.

The metal features 116 may include line structures 116L and via structures 116V. The metal features 116 may be formed of any suitable electrically conductive material, such as tungsten (W), copper (Cu), a copper alloy, aluminum (Al), an aluminum alloy, combinations thereof, or the like. Other suitable electrically conductive materials are within the contemplated scope of disclosure.

The metal features 116 may be electrically connected to the gate electrodes 104, such that the first interconnect structure 110 may electrically connect semiconductor devices formed on the first semiconductor substrate 102.

The first seal ring 120 may extend around the periphery of the first die 100. For example, the first seal ring 120 may extend through the dielectric layers 112, 114, at the periphery of the first interconnect structure 110. The first seal ring 120 may include line structures 120L and via structures 120V. The first seal ring 120 may be configured to protect the first interconnect structure 110 from contaminant diffusion and/or physical damage during device processing, such as plasma etching and/or deposition processes.

The first seal ring 120 may include copper at an atomic percentage greater than 80%, such as greater than 90% and/or greater than 95% although greater or lesser percentages may be used. The first seal ring 120 may include line structures 120L and via structures 120V that are electrically connected to each other and may be formed simultaneously with the line structures 116L and via structures 116V of the metal features 116, and/or the line structures 162L, 164L, and the via structures 162V, 164V, of the first and second guard rings 162, 164. The first seal ring 120 may be electrically isolated from the metal features 116.

In some embodiments, the first die 100 may also include one or more through silicon via (TSV) structures 150. The TSV structure 150 may extend into and/or through the first semiconductor substrate 102, the ILD layer 112, and one or more of the IMD layers 114, to electrically connect the metal features 116 to elements of the first semiconductor substrate 102 and or elements of adjacent dies. The TSV structure 150 may be formed of an electrically conductive metal. For example, the TSV structure 150 may include copper at an atomic percentage greater than 80%, such as greater than 90% and/or greater than 95%, although greater or lesser percentages of copper may be used. Other suitable electrically conductive metal materials for the TSV structure may be within the contemplated scope of disclosure.

In various embodiments, the first die 100 may include a first guard ring structure 160 disposed in the interconnect structure 110, surrounding the TSV structure 150. The first guard ring structure 160 may be formed of any of the materials used to form the TSV structure and/or the metal features 116. For example, the first guard ring structure 160 may be formed of Cu, Ta, TaN, Ti, TiN, CoW, combinations thereof, or the like. Other electrically conductive metal materials for the first guard ring structure 160 may be within the contemplated scope of disclosure.

The first guard ring structure 160 may include concentric first and second guard rings 162, 164. In particular, the first guard ring 162 may surround the TSV structure 150 and the second guard ring 164 may surround the first guard ring 162. The first guard ring structure 160 may extend through a subset of the IMD layers 114, such as IMD layers 114A-114C. Accordingly, the first guard ring structure 160 and the TSV structure 150 may extend through the same subset of the IMD layers 114. The first guard ring structure 160 and the TSV structure 150 may also extend through the ILD layer 112. However, in some embodiments, the first guard ring structure 160 may not extend through the ILD layer 112.

The guard rings 162, 164 may respectively include line structures 162L, 164L and via structures 162V, 164V. In some embodiments, the top surface of the line structures 162L, 164L of the first and second guard rings 162, 164 and the top surface of the line structures 116L of the metal features 116 may be coplanar in in each IMD layer 114; and the top surface of the via structures 162V, 164V of the first and second guard rings 162, 164 and the top surface of the via structures 116V of the metal features 116 may be coplanar in in each IMD layer 114.

In some embodiments, the metal features 116, the guard ring structure 160, and/or the first seal ring 120 may be formed by a dual-Damascene process or by multiple single Damascene processes. Single-Damascene processes generally form and fill a single feature with copper per Damascene stage. Dual-Damascene processes generally form and fill two features with copper at once, e.g., a trench and overlapping through-hole may both be filled with a single copper deposition using dual-Damascene processes. In alternative embodiments, the metal features 116, first guard ring structure 160 and/or the first seal ring 120 may be formed by an electroplating process.

For example, the Damascene processes may include patterning the dielectric layers 112, 114 to form openings, such as trenches and/or though-holes (e.g., via holes). A deposition process may be performed to deposit a conductive metal (e.g., copper) in the openings. A planarization process, such as chemical-mechanical planarization (CMP) may then be performed to remove excess copper (e.g., overburden).

In particular, the patterning, metal deposition, and planarizing processes may be performed for each of the dielectric layers 112, 114, in order to form the metal features 116 and/or portions of the guard ring 160, the first seal ring 120, and/or the first guard ring structure 160 therein. For example, the ILD layer 112 may be deposited and patterned to form via structures and/or trenches. A deposition process may then be performed to fill the openings in the ILD layer 112 with a conductive material. A planarization process may then be performed to remove the overburden and form via structures 120V, 162V, 164V and/or line structures 116L, 162L, 164L, in the ILD layer 112.

The above deposition, patterning, and planarization processes may be repeated to form IMD layers 114A-114E and via structures 116V, 120V, 162V, 164V, and/or line structures 116L, 120L, 162L, 164L therein. Accordingly, in some embodiments, elements of the metal features 116, first seal ring 120, and first guard ring structure 160 may be formed by the same processes and at the same time, when forming each dielectric layer 112, 114A-114E.

In some embodiments, barrier layers (not shown) may be disposed between the dielectric layers 112, 114, and the metal features 116, the first seal ring 120, TSV structure 150, and/or guard ring structure 160, to prevent metal diffusion into the semiconductor substrate 102 and/or dielectric layers 112, 114. The barrier layer may include Ta, TaN, Ti, TIN, CoW, combinations thereof, or the like, for example. Other suitable barrier layer materials are within the contemplated scope of disclosure.

Figure 2A:
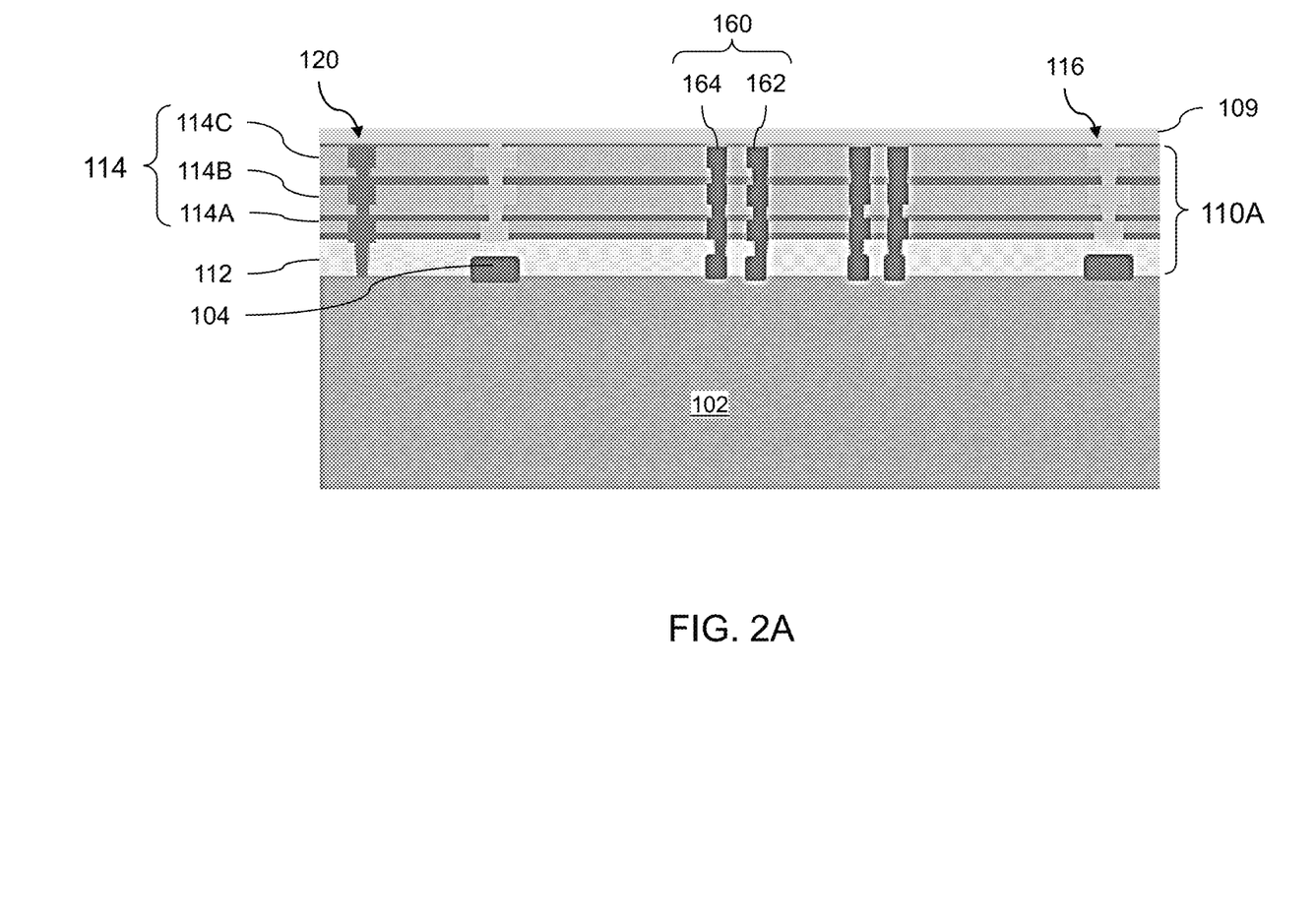
FIG. 2A is a vertical cross-sectional view of an intermediate structure formed during the formation of a TSV structure of the semiconductor die of FIG. 1A.

FIG. 2A is a vertical cross-sectional view of an intermediate structure formed during the formation of a TSV structure of the of the semiconductor die of FIG. 1A. As shown in FIG. 2A, an intermediate structure 110A including the ILD layer 112 and one or more IMD layers 114, such as IMD layers 114A-11C, for example, may be formed on the first semiconductor substrate 102. However, the present disclosure is not limited to any particular intermediate structure, or any particular number of IMD layers 114. The intermediate structure 110A may also include a portion of the metal features 116, first seal ring 120, and the guard ring structure 160. A mask layer 109 may be deposited on the intermediate structure 110A, using any suitable deposition process and photoresist material.

Figure 2B:
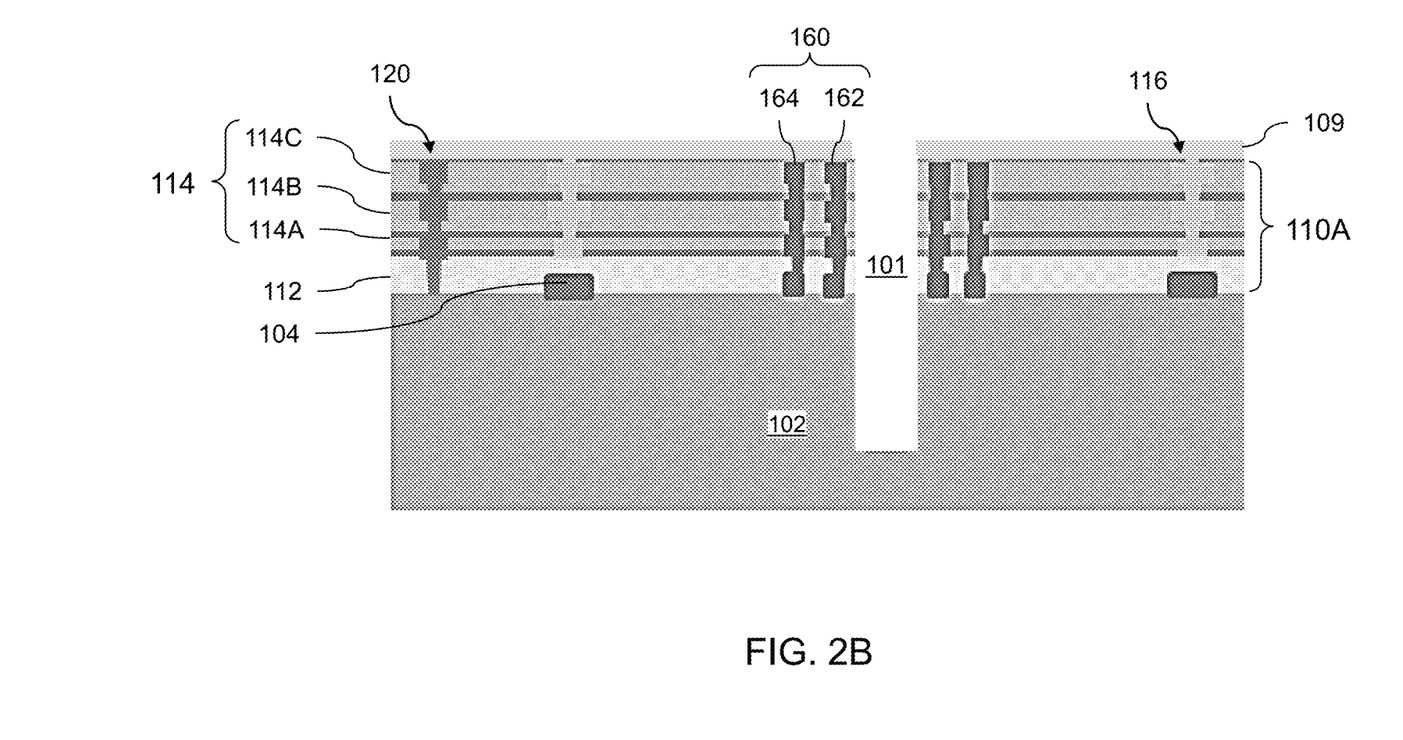
FIG. 2B is a vertical cross-sectional view of an intermediate structure formed during the formation of a TSV structure of the semiconductor die of FIG. 1A after the formation of a deep trench.

FIG. 2B is a vertical cross-sectional view of an intermediate structure formed during the formation of a TSV structure of the of the semiconductor die of FIG. 1A after the formation of a deep trench. Referring to FIG. 2B, the mask layer 109 may be patterned using a photolithography process, for example, to expose a portion of the intermediate structure 110A inside of the guard ring structure 160. An etching process may then be performed to form a trench 101 in the exposed portion of the intermediate structure 110A. The etching may include a dry etching method such as plasma (e.g., fluorine containing plasma) etching, a wet etching process, or a combination thereof.

The trench 101 may extend through the IMD layers 114A-114C, the ILD layer 112, and into the first semiconductor substrate 102. The trench 101 may partially or completely extend through the first semiconductor substrate 102. The trench 101 may be formed inside of the guard ring structure 160.

During the etching process and/or after the trench 101 is formed, the intermediate structure 110A may be exposed to contaminants such as water, etching chemicals, sulfur, fluorine, etc. as part of the device fabrication. The mask layer 109 may be formed of a material that is resistant to the diffusion of the contaminants. However, side walls of the ILD layer 112 and one or more IMD layers 114, may be exposed to contaminants inside of the trench 101. As noted above, the IMD layers 114 may be formed of ELK dielectric materials, such as porous ELK dielectric materials. As such, the IMD layers 114 may be particularly susceptible to the diffusion of contaminants, which may result in an electrical failure. For example, contaminants may electrically short the metal features 116.

Figure 2C:
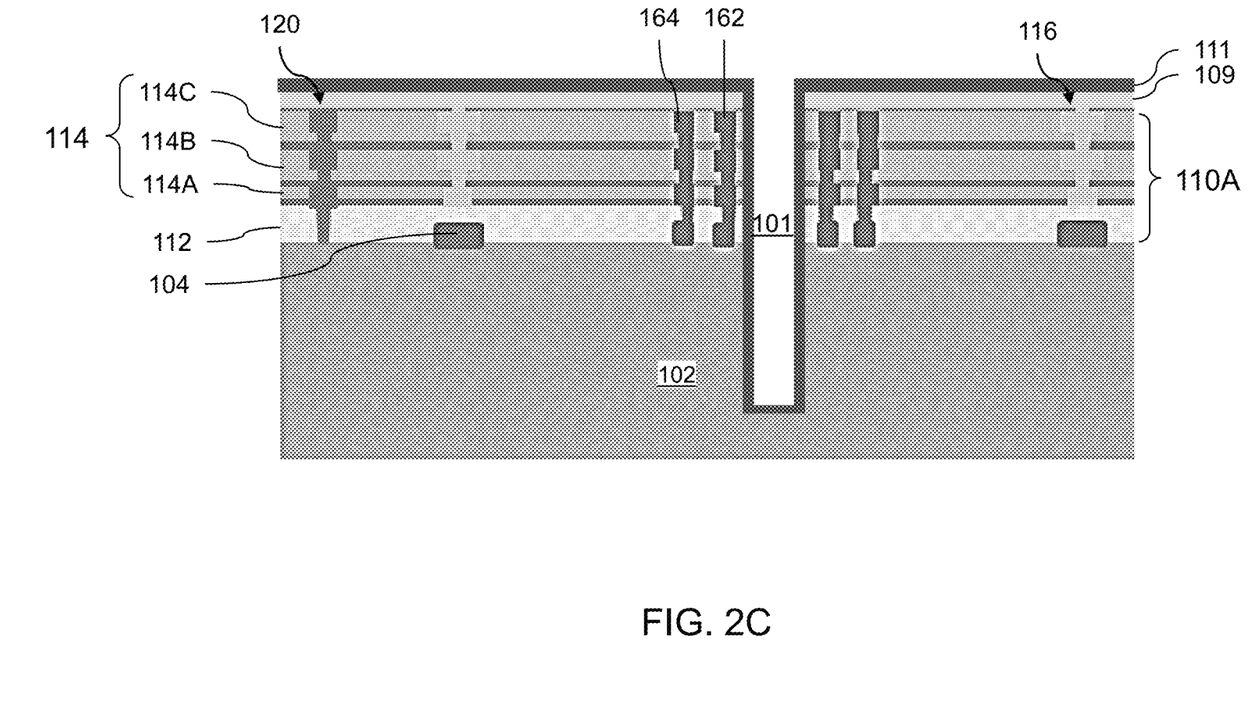
FIG. 2C is a vertical cross-sectional view of an intermediate structure formed during the formation of a TSV structure of the semiconductor die of FIG. 1A after the deposition of a barrier layer over a mask layer and in the deep trench.

FIG. 2C is a vertical cross-sectional view of an intermediate structure formed during the formation of a TSV structure of the of the semiconductor die of FIG. 1A after the deposition of a barrier layer over a mask layer and in the deep trench as shown in FIG. 2B. Referring to FIG. 2C, a barrier layer 111 may be deposited on the mask layer 109 and in the trench 101, using any suitable deposition process, such as PVD, CVD, etc. The barrier layer 111 may be formed of any suitable barrier layer material, such as Ta, TaN, Ti, TiN, CoW, combinations thereof, or the like. Other suitable barrier layer materials are within the contemplated scope of disclosure.

Figure 2D:
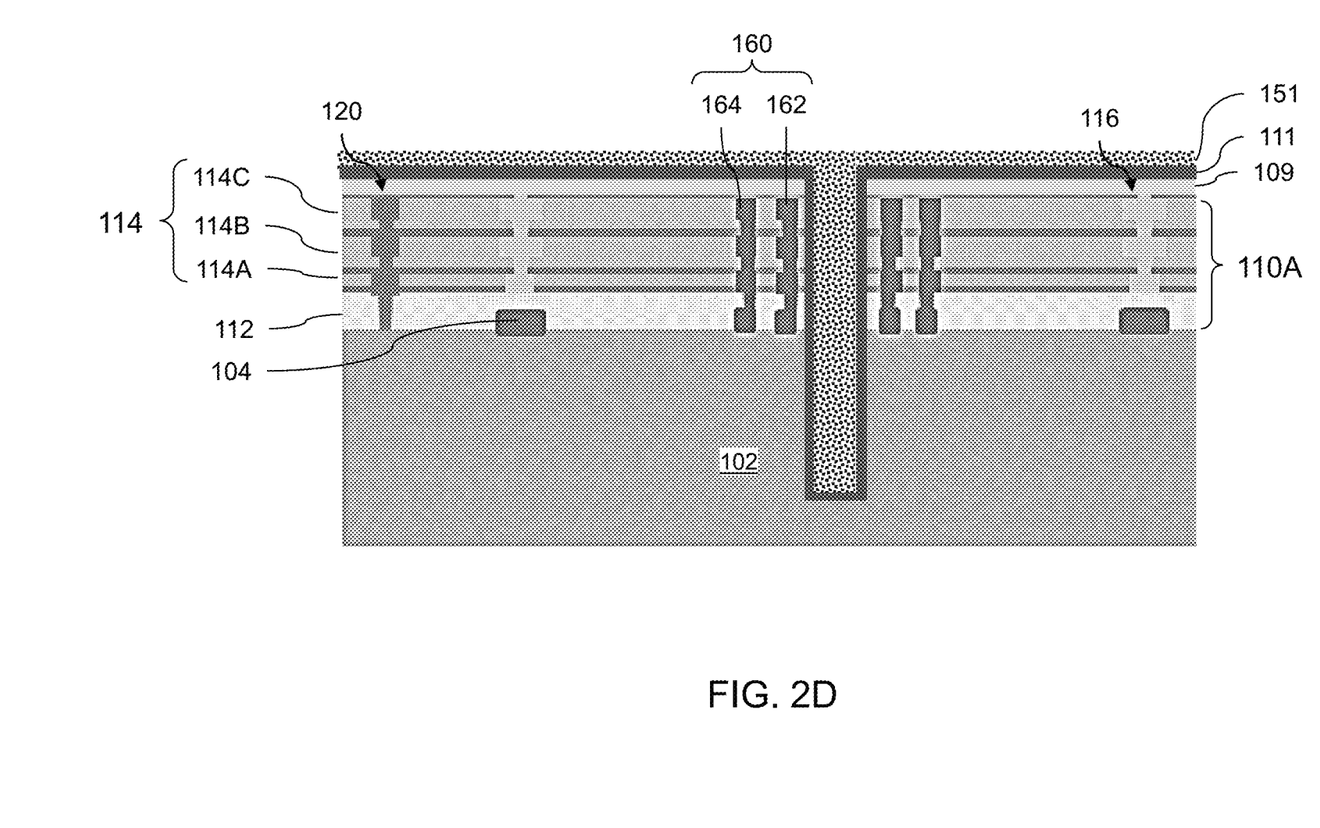
FIG. 2D is a vertical cross-sectional view of an intermediate structure formed during the formation of a TSV structure of the semiconductor die of FIG. 1A after the deposition of an electrically conductive material over the barrier layer in the deep trench.

FIG. 2D is a vertical cross-sectional view of an intermediate structure formed during the formation of a TSV structure of the of the semiconductor die of FIG. 1A after the deposition of an electrically conductive material over the barrier layer in the deep trench as shown in FIG. 2C. Referring to FIG. 2D, an electrically conductive material 151 may be deposited on the barrier layer 111 and in the trench 101. The electrically conductive material 151 may be deposited using any suitable method, such as electroplating, CVD, PVD, etc.

Figure 2E:
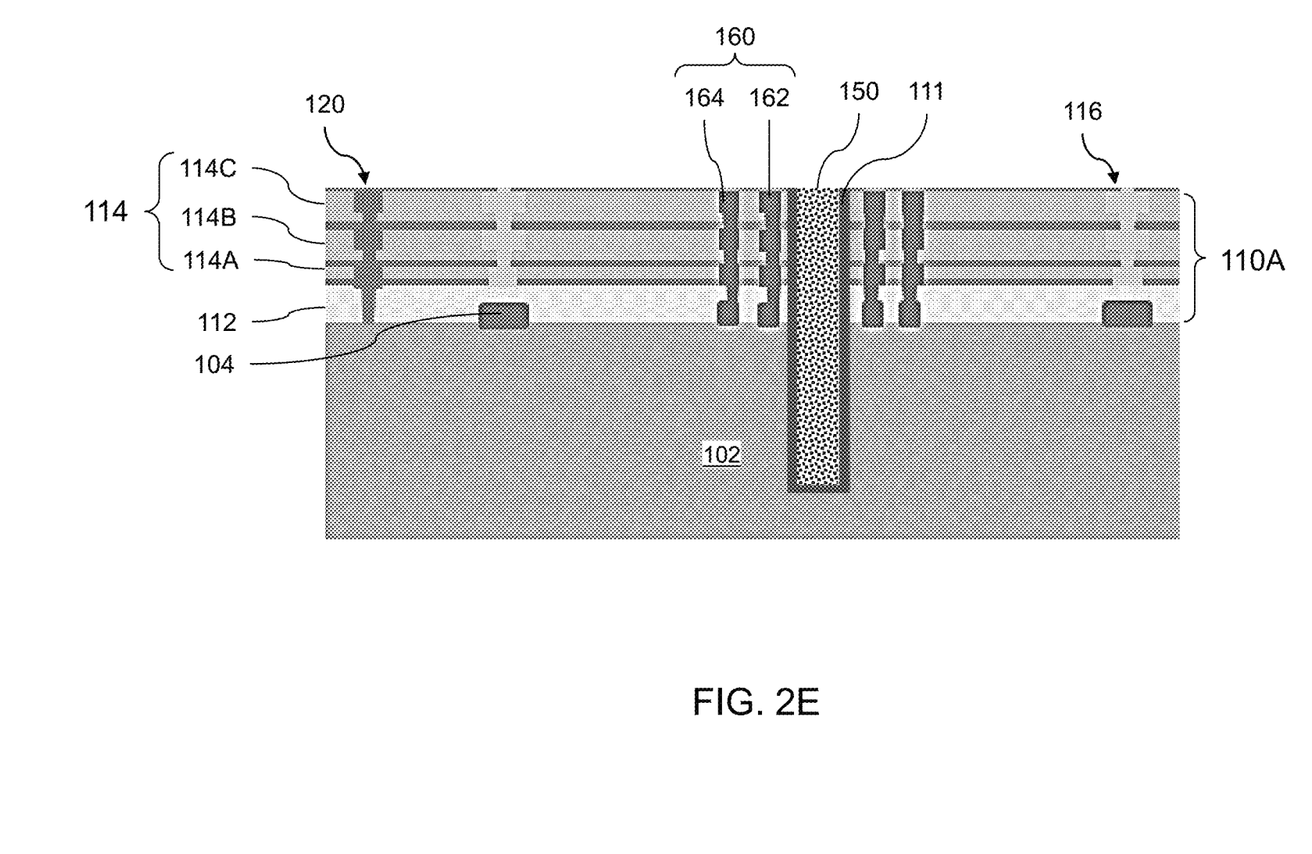
FIG. 2E is a vertical cross-sectional view of an intermediate structure formed during the formation of a TSV structure of the semiconductor die of FIG. 1A after the planarization of the electrically conductive material, barrier layer and hard mask layer.

FIG. 2E is a vertical cross-sectional view of an intermediate structure formed during the formation of a TSV structure 150 of the of the semiconductor die of FIG. 1A after the planarization of the electrically conductive material 151, barrier layer 111 and hard mask layer 109 as shown in FIG. 2D. Referring to FIG. 2E, the intermediate structure may be planarized using CMP, for example, to for the TSV structure 150 by removing portions of the electrically conductive material 151 and the barrier layer 111. After planarization, additional IMD layers 114, metal features 116, and portions of the first seal ring 120, may be formed as described above.

The first guard ring structure 160 may surround the trench 101 and may be configured to prevent the diffusion of contaminants into the ILD layer 112 and/or the IMD layers 114. In particular, the first guard ring 162 may be sufficient to contain any contaminants and/or prevent the diffusion of contaminants, since the contaminants cannot diffuse through the metal of the first guard ring 162. However, since the TSV structure 150 is configured to conduct electrical current, significant parasitic capacitance may be induced between a single guard ring 162 and the TSV structure 150. Accordingly, the first guard ring structure 160 may include at least the second guard ring 164, which may operate to reduce the electrical impact of the first guard ring structure 160 on the TSV structure 150, by reducing the parasitic capacitance.

Figure 3A:
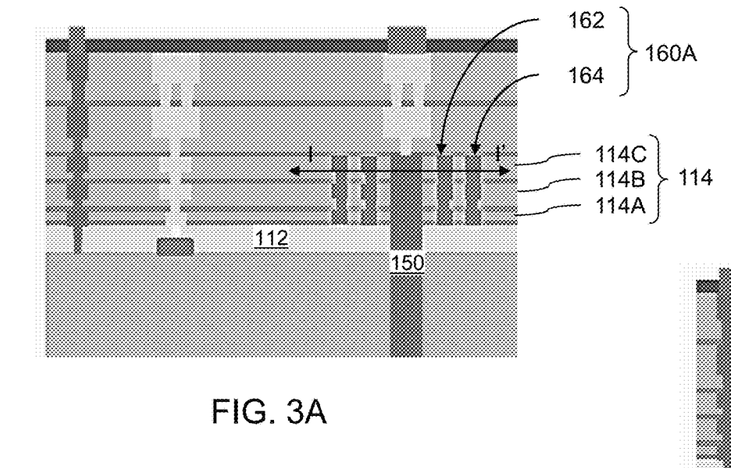
FIGS. 3A-3C are cross-sectional views of alternative via guard ring structures, according to various embodiments of the present disclosure.
Figure 3B:
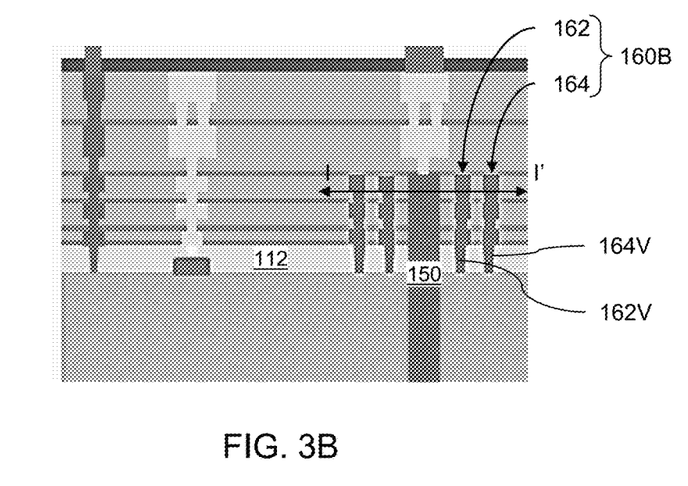
Figure 3C:
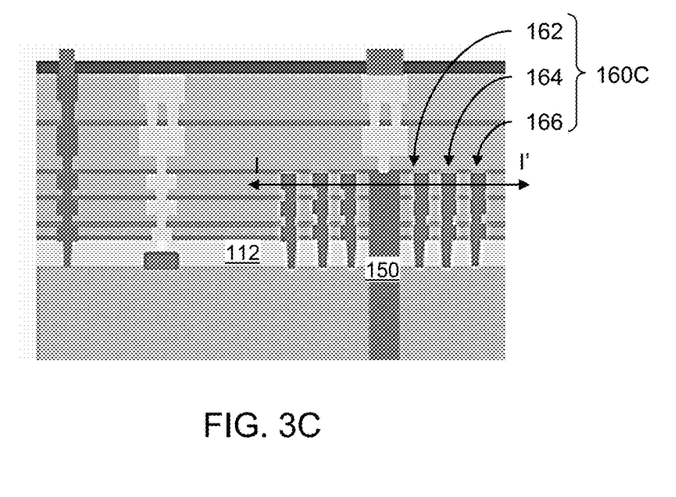

FIGS. 3A-3C are vertical cross-sectional views respectively showing guard ring structures 160A-160C, according to various embodiments of the present disclosure. The guard ring structures 160A-160C may be similar to the guard ring structure 160. As such, only the difference there between will be discussed in detail.

Referring to FIG. 3A, the guard ring structure 160A may include first and second guard rings 162, 164. However, in contrast to the guard ring structure 160, the first and second guard rings 162, 164 of the guard ring structure 160A may be disposed in only the IMD layers 114, such as IMD layers 114A-114C. In particular, the ILD layer 112 may be formed of a material having a higher resistance to contaminant diffusion than the IMD layers 114. As such, line and/or via structures of the guard ring structure 160A may be omitted from the ILD layer 112, in some embodiments.

Referring to FIG. 3B, the guard ring structure 160B may include first and second guard rings 162, 164. However, in contrast to the guard ring structure 160, the first and second guard rings 162, 164 of the guard ring structure 160B may include only via structures 162V, 164V in the ILD layer 112. In other words, the guard ring structure 160B may omit line structures 162L, 164L of the guard ring structure 160 in the ILD layer 112.

Referring to FIG. 3C, the guard ring structure 160B may include first, second, and third guard rings 162, 164, 166. In particular, the third guard rings 166 may surround the second guard rings 164. The third guard ring structures 166 may be configured to further reduce the effects of parasitic capacitance generated by current flow through the TSV structure 150.

Figure 4A:
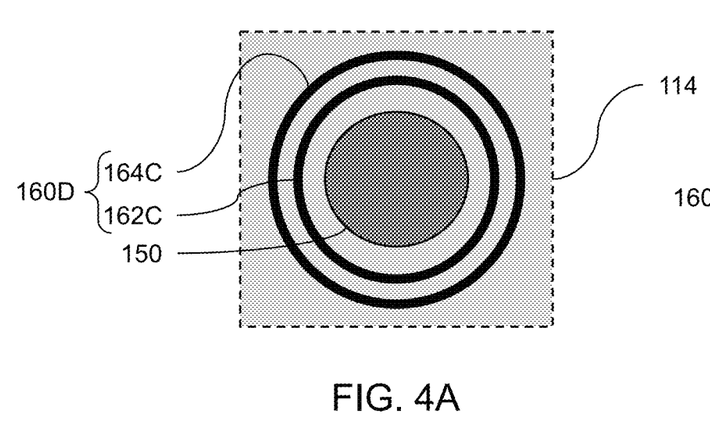
FIGS. 4A-4C are horizontal cross-sectional views of alternative via guard ring structures, according to various embodiments of the present disclosure.
Figure 4B:
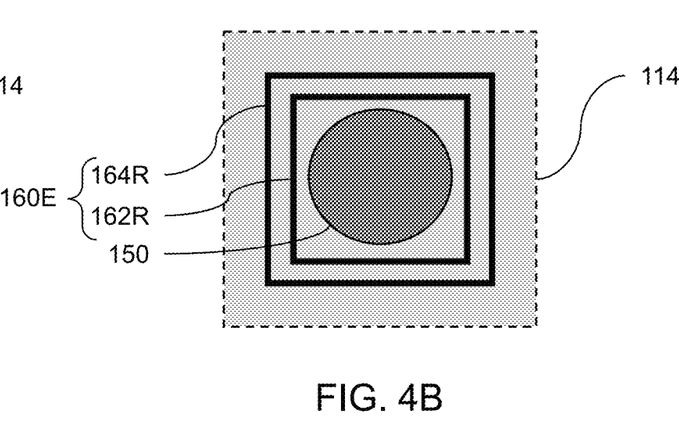
Figure 4C:
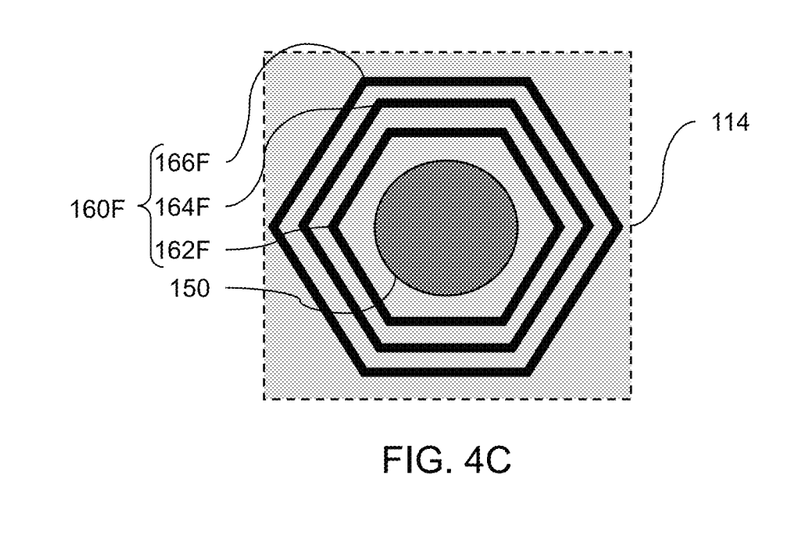

FIGS. 4A-4C are horizontal cross-sectional views of guard ring structures 160D-160F, respectively taken through lines I-I' of FIGS. 3A-3C, according to various embodiments of the present disclosure. The horizontal cross-sectional views of guard ring structures 160D-160F may correspond to any of the guard ring structures 160-160C. As such, only the difference there between will be discussed in detail.

Referring to FIG. 4A, the guard ring structure 160D may include circular first and second guard rings 162C, 164C. In other words, the first and second guard rings 162C, 164C may have circular horizontal cross-sections. Referring to FIG. 4B, the guard ring structure 160E may include rectangular first and second guard rings 162R, 164R. In other words, the first and second guard rings 162R, 164R may have rectangular horizontal cross-sections. Referring to FIG. 4C, the guard ring structure 160F may include polygonal first, second, and third guard rings 162F, 164F, 166F. In other words, the first, second, and third guard rings 162F, 164F, 166F may have polygonal horizontal cross-sections. However, the present disclosure is not limited to guard rings having any particular horizontal cross-sectional shape. For example, guard rings may have any suitable horizontal cross-sectional shapes, provided that the guard rings surround a corresponding TSV structure.

Figure 5A:
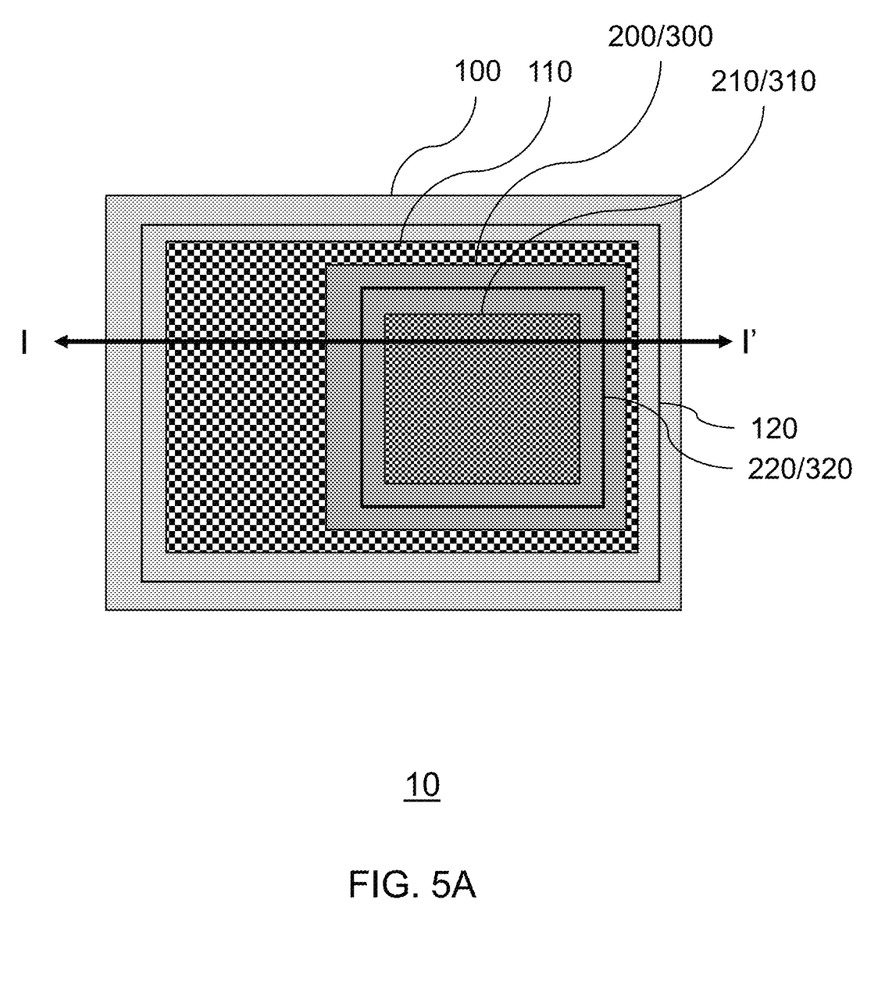
FIG. 5A is a simplified top view of a three dimensional device structure, according to various embodiments of the present disclosure.
Figure 5B:
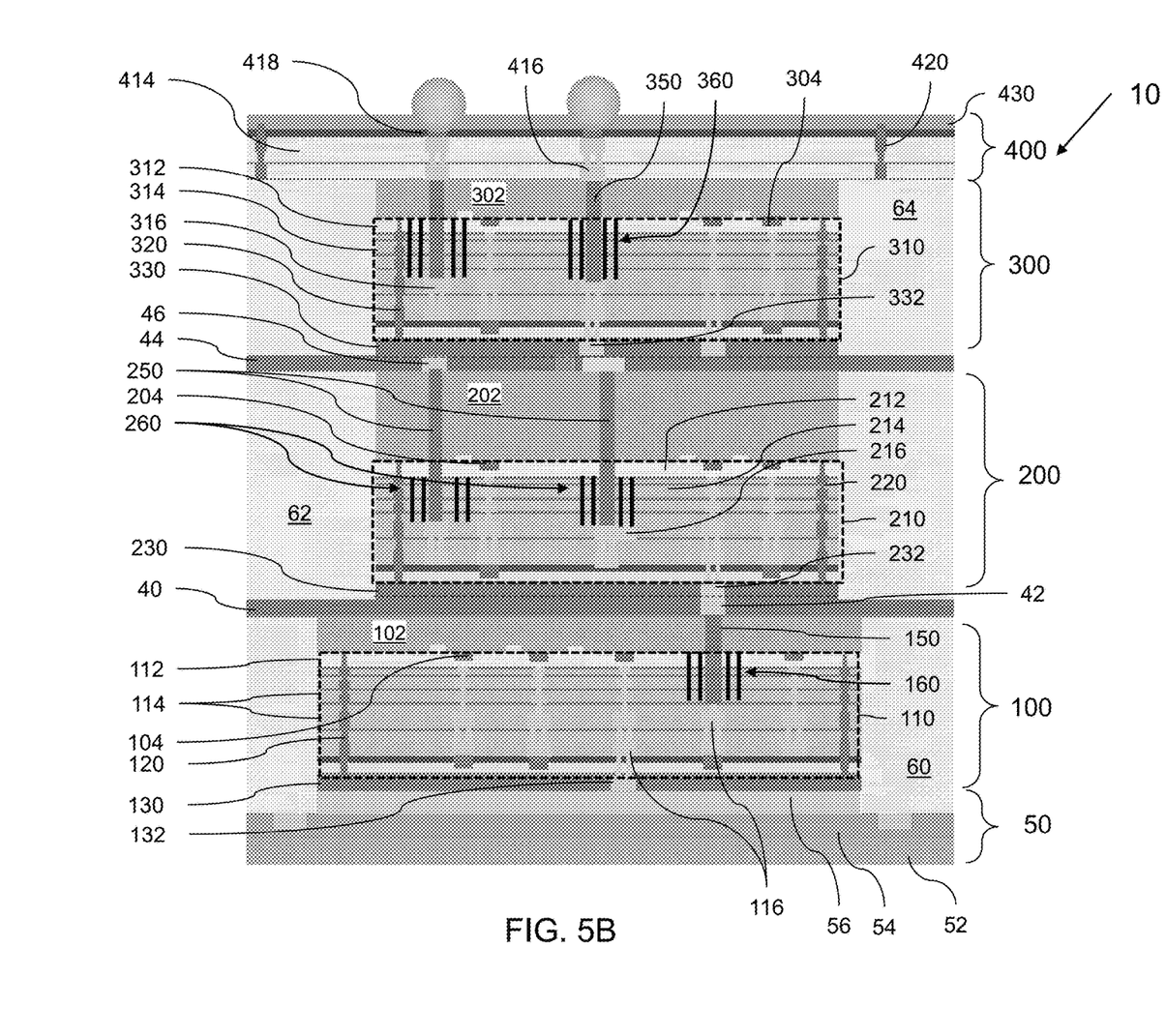
FIG. 5B is a cross-sectional view taken along line I-I' of FIG. 5A.

FIG. 5A is a simplified top view of a three-dimensional device structure 10 including the first die 100 of FIGS. 1A and 1B, according to various embodiments of the present disclosure. FIG. 5B is a cross-sectional view taken along line I-I' of FIG. 5A Referring to FIGS. 5A-5B, the three-dimensional (3D) device structure 10 may be referred to herein as a 3D integrated circuit (3D IC) and may include a wafer 50 upon which the first die 100, a second die 200, and a third die 300 are stacked and bonded together. Herein, the numbering of the first, second, and third dies 100, 200, 300 is used for descriptive purposes only and is not intended to imply that any particular numbered die is required to have any particular feature described herein.

The wafer 50 may include a semiconductor substrate 52, a passivation layer 54, and a wafer bonding layer 56. The semiconductor substrate 52 may include an elementary semiconductor such as silicon or germanium and/or a compound semiconductor such as silicon germanium, silicon carbide, gallium arsenic, indium arsenide, gallium nitride, indium phosphide, or the like. Other semiconductor materials are within the contemplated scope of the disclosure. In some embodiments, the wafer 50 may be a master die including semiconductor devices configured to control the functions of the dies 100, 200, 300.

The dies 100, 200, 300 may be, for example, an application-specific integrated circuit (ASIC) chip, an analog chip, a sensor chip, a wireless and radio frequency chip, a voltage regulator chip, or a memory chip. Other chips are within the contemplated the scope of disclosure. In various embodiments, the dies 100, 200, 300 may be the same or different types of chips. In some embodiments, the dies 100, 200, 300 may each be an active component or a passive component.

The first die 100 may be inverted and bonded to the wafer 50, such that a front side of the first semiconductor substrate 102 faces the wafer 50. The first interconnect structure 110 may be disposed between the front side of the semiconductor substrate 102 and the wafer 50.

A front side bonding layer 130 may be disposed on the first interconnect structure 110, facing the front side of the first semiconductor substrate 102. The front side bonding layer 130 may be formed by depositing a dielectric material, such as silicon oxide, silicon nitride, a polymer, or the like, or a combination thereof, using any suitable deposition process. Other dielectric materials are within the contemplated scope of disclosure. Bonding metal features 132 may be formed in the front side bonding layer 130. The metal features 132 may include an electrically conductive metal, such as tungsten (W), copper (Cu), a copper alloy, aluminum (Al), an aluminum alloy, a combination thereof, or the like. As noted above, other suitable electrically conductive metal materials are within the contemplated scope of disclosure. The metal features 132 may be formed by a dual-Damascene processes, or by one or more single-Damascene processes, as described above. In alternative embodiments, the metal features 132 may be formed by an electroplating process.

A first dielectric encapsulation (DE) layer 60 may surround the first die 100 and may cover exposed portions of the wafer 50. Specifically, the first DE layer 60 may surround the sidewalls of the first die 100, expose the top of the first die 100, and overlay the front side of the wafer 50. In some embodiments, the back side of the first semiconductor substrate 102 may be substantially co-planar with the top surface of the first DE layer 60. In some embodiments, the first DE layer 60 includes a molding compound. The molding compound may include a resin and a filler. In alternative embodiments, the first DE layer 60 may include silicon oxide, silicon nitride, or a combination thereof, or the like. The first DE layer 60 may be formed by spin-coating, lamination, deposition or the like.

A back side bonding layer 40 may be formed on the back side of the first semiconductor substrate 102 and on the surface of the first DE layer 60. The back side bonding layer 40 may be formed by depositing a dielectric material, such as silicon oxide, silicon nitride, a polymer, a combination thereof, or the like, using any suitable deposition process. Bonding metal features 42 may be formed in the backside bonding layer 40. The metal features 42 may be formed of a conductive metal as described above with respect to the metal features 116.

In some embodiments, the second die 200 may be similar to the first die 100. For example, the second die 200 may include a second semiconductor substrate 202, a second interconnect structure 210, and a front side bonding layer 230. In addition, the second die 200 may include one or more second guard ring 260 structures respectively surrounding second TSV structures 250.

The second interconnect structure 210 may be disposed over a first side (e.g., front side) of the second semiconductor substrate 202. The second interconnect structure 210 may have a single-layer or multi-layer structure. For example, as shown in FIG. 5B, the second interconnect structure 210 may include an ILD layer 212, IMD layers 214, metal features 216, and a second seal ring 220.

The metal features 216 may be electrically connected to an integrated circuit region of the second semiconductor substrate 202. In some embodiments, the metal features 216 may be electrically connected to gate electrodes 204 of the second semiconductor substrate 202, such that the second interconnect structure 210 may electrically connect semiconductor devices formed on the second semiconductor substrate 202.

The second seal ring 220 may be similar to the first seal ring 120. For example, the second seal ring 220 may include copper at an atomic percentage greater than 80%, such as greater than 90% and/or greater than 95%, although greater or lesser percentages of copper may be used. The second seal ring 220 may be disposed over the front side of the second semiconductor substrate 202. Specifically, the second seal ring 220 may surround the second interconnect structure 210, may extend through the dielectric layers 212, 214, and may surround the metal features 216. In some embodiments, the second seal ring 220 may be formed during the formation of the dielectric layers 212, 214. The top surface of the second seal ring 220 may be coplanar with the top surfaces of the uppermost metal features 216 of the second interconnect structure 210.

In some embodiments, the size of the second die 200 may be different from (e.g., less than) the size of the first die 100. Herein, the term "size" refers to the length, width and/or area. For example, as shown in the top view of FIG. 5A, the size (e.g., area or footprint) of the second die 200 may be less than the size of the first die 100.

The second TSV structures 250 may extend through the second semiconductor substrate 202, the ILD layer 212, and one or more of the IMD layers 214, to electrically connect one of the metal features 216 to a die bonding pad 46. The second TSV structure 250 may be formed of an electrically conductive metal. For example, the second TSV structure 250 may include copper at an atomic percentage greater than 80%, such as greater than 90% and/or greater than 95%, although greater or lesser percentages of copper may be used. Other suitable electrically conductive metals may be within the contemplated scope of disclosure.

A second DE layer 62 may surround the second die 200 and may cover exposed portions of the back side bonding layer 40. Specifically, the second DE layer 62 may surround the sidewalls of the second die 200, expose the top of the second die 200, and overlay back side bonding layer 40. In some embodiments, the back side of the second semiconductor substrate 202 may be substantially co-planar with the top surface of the second DE layer 62. In some embodiments, the second DE layer 62 includes a molding compound. The molding compound may include a resin and a filler. In alternative embodiments, the second DE layer 62 may include silicon oxide, silicon nitride, a combination thereof, or the like. The second DE layer 62 may be formed by spin-coating, lamination, deposition, or the like.

A back side bonding layer 44 may be formed on the back side of the second semiconductor substrate 202 and on the top surface of the second DE layer 62. The back side bonding layer 44 may be formed by depositing a dielectric material, such as silicon oxide, silicon nitride, a polymer, a combination thereof, or the like, using any suitable deposition process. Metal features 46 may be formed in the back side bonding layer 44. The metal features 46 may be formed of a conductive metal as described above with respect to the metal features 116.

The third die 300 may be similar to the second die 200. For example, the third die 300 may include a third semiconductor substrate 302, a third interconnect structure 310, and a front side bonding layer 330. In addition, the third die 300 may include third guard ring structures 360 respectively surrounding third TSV structures 350.

The third interconnect structure 310 may be disposed over a first side (e.g., front side) of the third semiconductor substrate 302. The third interconnect structure 310 may have a single-layer or multi-layer structure. For example, as shown in FIG. 5B, the third interconnect structure 310 may include an ILD layer 312, IMD layers 314, metal features 316, and a third ring 320.

The metal features 316 may be electrically connected to an integrated circuit region of the third semiconductor substrate 302. In some embodiments, the metal features 316 may be electrically connected to gate electrodes 304 of the third semiconductor substrate 302, such that the third interconnect structure 310 may electrically connect semiconductor devices formed on the third semiconductor substrate 302.

The third seal ring 320 may be similar in structure and composition to the second seal ring 220. The front side bonding layer 330 may be similar in structure and composition to the front side bonding layer 230. In particular, electrically conductive metal features 332 may be formed in the front side bonding layer 330.

The third TSV structures 350 may extend through the third semiconductor substrate 302, the ILD layer 312, and one or more of the IMD layers 314, to electrically connect one or more of the metal features 316 to corresponding gate electrodes 304 of the third semiconductor substrate 302. The third TSV structure 350 may be formed of an electrically conductive metal. For example, the TSV structure 350 may include copper at an atomic percentage greater than 80%, such as greater than 90% and/or greater than 95%, although greater or lesser percentages of copper may be used. Other suitable electrically conductive metals may be within the contemplated scope of disclosure.

A third DE layer 64 may surround the third die 300 and may cover exposed portions of the back side bonding layer 44. Specifically, the third DE layer 64 may surround the sidewalls of the third die 300, expose the top of the third die 300, and overlay back side bonding layer 44. In some embodiments, the back side of the third semiconductor substrate 302 may be substantially co-planar with the top surface of the third DE layer 64. In some embodiments, the third DE layer 64 includes a molding compound. The molding compound may include a resin and a filler. In alternative embodiments, the third DE layer 64 may include silicon oxide, silicon nitride, a combination thereof, or the like. The third DE layer 64 may be formed by spin-coating, lamination, deposition or the like.

In some embodiments, a diffusion barrier layer (not shown) may be disposed around the metal features 116, 216, 316, and/or the first TSV structure 150, second TSV structure 250, third TSV structure 350, to prevent metal diffusion into adjacent layers. The diffusion barrier layer may include Ta, TaN, Ti, TiN, CoW, a combination thereof, or the like. Other suitable barrier layer materials may be within the contemplated scope of disclosure.

A redistribution layer structure 400 may be disposed on the backside of the third die 300, over the third DE layer 64. The redistribution layer structure 400 may include one or more dielectric layers 414, metal features 416, bonding pads 418, a fourth seal ring 420, and a passivation layer 430. In some embodiments, the metal features 416 may be electrically connected to the third TSV structures 350.

In some embodiments, the dielectric layers 414 may include a photo-sensitive material such as polybenzoxazole (PBO), polyimide (PI), benzocyclobutene (BCB), a combination thereof, or the like. In some embodiments, the metal features 416 may include copper, nickel, titanium, a combination thereof, or the like. Other suitable conductive metal materials may be within the contemplated scope of disclosure to form the metal features 416.

The fourth seal ring 420 may surround the metal features 416. The fourth seal ring 420 may include materials and structures similar to that of the first seal ring 120 and/or second seal ring 220.

The bonding pads 418 may be disposed on the dielectric layers 414. In some embodiments, the bonding pads 418 may be under bump metallization (UBM) pads for mounting conductive connectors, such as metal pillars, .micro-bumps or the like. The pads 418 may include a metal or a metal alloy. The bonding pads 418 may include aluminum, copper, nickel, an alloy thereof, or the like, for example. Other suitable pad materials may be within the contemplated scope of disclosure.

The passivation layer 430 may cover the dielectric layers 414 and edge portions of the pads 418. Upper surfaces of the pads 418 may be exposed through the passivation layer 430. In some embodiments, the passivation layer 430 includes silicon oxide, silicon nitride, benzocyclobutene (BCB) polymer, polyimide (PI), polybenzoxazole (PBO), a combination thereof, or the like.

The first die 100 may be flipped (e.g., inverted) and disposed over the wafer 50. The front side bonding layer 130 may be bonded to the wafer bonding layer 56, in order to bond the first die 100 to the wafer 50. The bonding may include any suitable bonding process, such as a thermal annealing or chemical bonding process. The bonding process may include electrically connecting the metal features 132 to metal features (not shown) of the wafer bonding layer 56. The first DE layer 60 may then be deposited about the first die 100. The back side bonding layer 40 may be deposited on the first die 100 and the first DE layer 60, using any suitable deposition process.

The second die 200 may be flipped and disposed over the first die 100. The front side bonding layer 230 may be bonded to the backside bonding layer 40, to bond the front side of the second die 200 to the back side of the first die 100. The bonding may include any suitable bonding process, such as a thermal annealing or chemical bonding process. The bonding process may include electrically connecting the metal features 42, 232. The second DE layer 62 may then be deposited about the second die 200. The back side bonding layer 44 may be deposited on the second die 200 and the second DE layer 62, using any suitable deposition process.

The third die 300 may be flipped and disposed over the second die 100. The front side bonding layer 330 may be bonded to the backside bonding layer 44, to bond the back side of the second die 200 to the front side of the third die 300. The bonding may include any suitable bonding process, such as a thermal annealing or chemical bonding process. The bonding process may include electrically connecting the metal features 232, 332. The third DE layer 64 may then be deposited about the third die 300. The redistribution layer structure 400 may then be formed on the third die 300 and the third DE layer 64, using any suitable deposition processes.

The metal features 42, 44, 132, 232, 332, may include an electrically conductive bonding material, such as W, Cu, a Cu alloy, Al, an aluminum alloy, a combination thereof, or the like, and the bonding layers 40, 44, 56, 130, 230, 330 may be formed of any suitable dielectric material. The metal features 42, 44, 132, 232, 332, and the bonding layers 40, 44, 56, 130, 230, 330 may be formed by a dual-Damascene processes, by one or more single-Damascene processes, or by etching and electroplating processes.

In various embodiments, the first die 100, second die 200, or third die 300 may be formed on wafers and may be singulated prior to being individually positioned and bonded. In other embodiments, wafers including a plurality of the first die 100, second die 200, or third die 300 may be disposed over the wafer 50, the corresponding dies may be wafer-bonded, and then the corresponding dies may be singulated.

In some embodiments, the alignment of the first die 100, second die 200, and third die 300 may be achieved by using an optical sensing method. After the alignment is achieved, the bonding may be performed by a hybrid bonding process that includes a metal-to-metal bonding and a dielectric-to-dielectric bonding.

In various embodiments, a dicing process may be performed to singulate the three-dimensional device structure 10. For example, a grooving process may be performed to form grooves in a first wafer including the first dies 100 and/or in a second wafer including the second dies 200. In particular, first grooves may be formed that surround the first seal ring 120, second seal ring 220, and/or third seal ring 320. The three-dimensional device structures 10 may be diced along the grooves to complete the dicing process, for example, by mechanical cleavage.

In certain embodiments, the grooving process includes performing one or more laser cutting processes. For example, the laser cutting process may be performed several times with an infrared laser such as an Nd-YAG (neodymium-doped yttrium aluminum garnet) laser. In alternative embodiments, the grooving process may include a mechanical cutting process, an inscribing process, or an etching process.

Various embodiments provide a die 100 comprising: a semiconductor substrate 102; an interconnect structure 110 disposed on the semiconductor substrate 102 and comprising: inter-metal dielectric (IMD) layers 114; metal features 116 embedded in the IMD layers 114; and a first guard ring structure 160 comprising concentric first and second guard rings 162, 164 that extend through at least a subset of the IMD layers 114; and a first through silicon via (TSV) structure 150 extending through the semiconductor substrate 102 and the subset of IMD layers 114 to electrically contact one of the metal features 116. The first guard ring 162 surrounds the first TSV structure 150; and the second guard ring 164 surrounds the first guard ring 162 and is configured to reduce a parasitic capacitance between the first guard ring structure 160 and the TSV structure 150.

Various embodiments provide a die 100 comprising: a semiconductor substrate 102; an inter-layer dielectric (ILD) layer disposed on the semiconductor substrate; inter-metal dielectric (IMD) layers disposed on the ILD layer; metal features 116 embedded in the IMD layers 114; a first guard ring structure 160 comprising concentric first and second guard rings 162, 164 that extend through at least a subset of the IMD layers 114; a seal ring 120 extending through the ILD and IMD layers and surrounding the metal features 116 and the guard ring structure 160; and a first through silicon via (TSV) structure 150 extending through the semiconductor substrate 102 and the subset of IMD layers 114 to electrically contact one of the metal features 116. The first guard ring 162 surrounds the first TSV structure 150, and the second guard ring 164 surrounds the first guard ring 162 and is configured to reduce a parasitic capacitance between the first guard ring structure 160 and the first TSV structure 150.

Various embodiments provide a three-dimensional device structure 10 comprising: a first die 100 and a second die 200 bonded to the first die 100. The first die 100 comprises: a first semiconductor substrate 102; a first interconnect structure 110 disposed on the semiconductor substrate 102 and comprising: inter-metal dielectric (IMD) layers 114; a first guard ring structure 160 comprising concentric first and second guard rings 162, 164 embedded in the IMD layers 114; metal features 116 embedded in the IMD layers 114; a first seal ring 120 embedded in the IMD layers 114 and surrounding the metal features 116 and the guard ring structure 160; and a through silicon via (TSV) structure 150 extending through the first semiconductor substrate 102 and into the first interconnect structure 110, such that the first and second guard rings 162, 164 concentrically surround the first TSV structure 150. The second die 200 comprises a second interconnect structure 210 disposed on a second semiconductor substrate 202. Metal features 216 of the second interconnect structure 210 electrically connect the first TSV structure 150 to the second semiconductor substrate 202, and the second guard ring 164 is configured to reduce a parasitic capacitance between the first guard ring structure 160 and the first TSV structure 150.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor chip comprising:
a device layer comprising semiconductor devices;
an interconnect structure that electrically interconnects the semiconductor devices;
a through silicon via (TSV) structure that extends through the device layer and is electrically connected to the interconnect structure;
a first guard ring that surrounds a portion of the TSV structure that is embedded in the interconnect structure; and
a second guard ring configured to reduce a parasitic capacitance between the first guard ring and the TSV structure.

2. The semiconductor chip of claim 1, wherein the interconnect structure comprises:
inter-metal dielectric (IMD) layers; and
metal features embedded in the IMD layers.

3. The semiconductor chip of claim 2, wherein the IMD layers comprise an extra low-k (ELK) dielectric material having a dielectric constant (k) of less than 2.5.

4. The semiconductor chip of claim 3, wherein the ELK dielectric material has a dielectric constant (k) ranging from 2.5 to 2.2.

5. The semiconductor chip of claim 2, wherein:
the interconnect structure comprises an inter-layer dielectric (ILD) layer disposed between the semiconductor substrate and the IMD layers; and
the first and second guard rings extend through at least one of the IMD layers and the ILD layer.

6. The semiconductor chip of claim 5, wherein the first and second guard rings comprise via structures embedded in the ILD layer.

7. The semiconductor chip of claim 5, wherein the first and second guard rings comprise via structures and line structures embedded in the ILD layer.

8. The semiconductor chip of claim 2, wherein:
the interconnect structure comprises an inter-layer dielectric (ILD) layer disposed between the semiconductor substrate and the IMD layers; and
the first and second guard rings extend through at least one of the IMD layers and do not extend through the ILD layer.

9. The semiconductor chip of claim 2, wherein the IMD layers have a higher porosity than the ILD layer.

10. The semiconductor chip of claim 2, wherein the interconnect structure comprises a seal ring surrounding the metal features, the first TSV structure, and the second guard ring.

11. The semiconductor chip of claim 2, wherein:
the first and second guard rings comprise line structures and via structures embedded in the IMD layers;
the metal features comprise line structures and via structures embedded in the IMD layers;
the line structures of the first and second guard rings and the line structures of the metal features are coplanar in in each IMD layer; and
the via structures of the first and second guard rings and the via structures of the metal features are coplanar in in each IMD layer.

12. The semiconductor chip of claim 1, further comprising a third guard ring surrounding the second guard ring and configured to further reduce a parasitic capacitance between the first guard ring and the first TSV structure.

13. A semiconductor chip comprising:

a substrate;

an interconnect structure configured to electrically connect semiconductor devices formed on the substrate;

a through silicon via (TSV) structure extending through the substrate and into the interconnect structure;

a first guard ring configured to prevent and/or reduce metal diffusion from the TSV structure into the interconnect structure; and a second guard ring configured to reduce a parasitic capacitance between the first guard ring and the TSV structure.

14. The semiconductor chip of claim 13, further comprising a third guard ring surrounding the second guard ring and configured to reduce a parasitic capacitance between the first guard ring and the first TSV structure.

15. The semiconductor chip of claim 13, wherein the interconnect structure comprises:

inter-metal dielectric (IMD) layers;

metal features embedded in the IMD layers and configured to electrically connect the semiconductor devices;

an inter-layer dielectric (ILD) layer disposed between the semiconductor substrate and the IMD layers; and a seal ring surrounding the metal features, the first TSV structure, and the second guard ring.

16. The semiconductor chip of claim 15, wherein:

the first and second guard rings extend through the IMD layers and the ILD layer; and the IMD layers have a higher porosity than the ILD layer.

17. A semiconductor chip comprising:

a substrate;

an interconnect structure comprising:

inter-metal dielectric (IMD) layers;

metal features embedded in the IMD layers and configured to electrically connect semiconductor devices formed on a first side of the substrate; and a seal ring surrounding the metal features;

a through silicon via (TSV) structure that extends through the substrate to electrically connect the interconnect structure and the redistribution layer structure;

a first guard ring surrounding a portion of the TSV structure that is embedded in the interconnect structure;

a second guard ring configured to reduce a parasitic capacitance between the first guard ring and the TSV structure; and a third guard ring surrounding the second guard ring and configured to further reduce a parasitic capacitance between the first guard ring and the TSV structure, wherein the IMD layers comprise an extra low-k (ELK) dielectric material having a dielectric constant (k) of less than 2.5.

18. The semiconductor chip of claim 17, wherein first interconnect structure comprises:

inter-metal dielectric (IMD) layers;

metal features embedded in the IMD layers;

a first seal ring embedded in the IMD layers and surrounding the metal features and the second guard ring structure.

19. The semiconductor chip of claim 18, wherein the first and second guard rings comprise line structures and via structures embedded in the IMD layers.

20. The semiconductor chip of claim 18, further comprising an inter-layer dielectric (ILD) layer disposed between the semiconductor substrate and the IMD layers, wherein the first, second, and third guard rings extend through the ILD layer and at least one of the IMD layers and.

* * * * *